United States Patent [19]

Hirai et al.

[11] Patent Number: 4,688,004

[45] Date of Patent: Aug. 18, 1987

[54] FREQUENCY-CHANGEABLE MICROWAVE SIGNAL GENERATOR HAVING PLURAL SELECTIVELY OPERATED OSCILLATORS

[75] Inventors: Kenji Hirai; Yoshinori Kimura, both of Yokohama, Japan

[73] Assignee: Kabushiki Kaisha Toshiba, Kawasaki, Japan

[21] Appl. No.: 903,140

[22] Filed: Sep. 3, 1986

[30] Foreign Application Priority Data

Sep. 11, 1985 [JP] Japan ................... 60-199519

[51] Int. Cl.$^4$ .................. H01P 5/12; H04L 27/16
[52] U.S. Cl. ........................ 331/49; 331/56; 331/179; 375/66
[58] Field of Search ............. 331/49, 46, 48, 56, 331/107 P, 179; 375/66; 307/23, 64, 65, 80, 81

[56] References Cited

U.S. PATENT DOCUMENTS 3,092,789 6/1963 Cremin .................. 331/49 X
4,516,085 5/1985 Effinger et al. .......... 331/49 X

FOREIGN PATENT DOCUMENTS 6011843 9/1981 Japan.

Primary Examiner—Siegfried H. Grimm
Attorney, Agent, or Firm—Oblon, Fisher, Spivak, McClelland & Maier

[57] ABSTRACT

A frequency-changeable microwave signal generator has a plurality of microwave signal oscillators, a plurality of branch lines connected to the microwave signal oscillators, a transmission line connected to the plurality of branch lines and provided with an output port at one end thereof, and a means for selectively operating one of the microwave signal oscillators. The line lengths of the branch lines are set such that the output impedance of the microwave signal oscillator connected thereto, which is measured from a branch point for connecting the transmission line and the branch line, is at maximum when the microwave signal oscillators are inoperative. The relation $L=(\lambda/2)(k-1)$ ($k$ is a natural number) is satisfied where $L$ is a distance along the transmission line between adjacent branch portions of the branch lines connected to the transmission line, and $\lambda$ is a predetermined operational wavelength.

20 Claims, 7 Drawing Figures

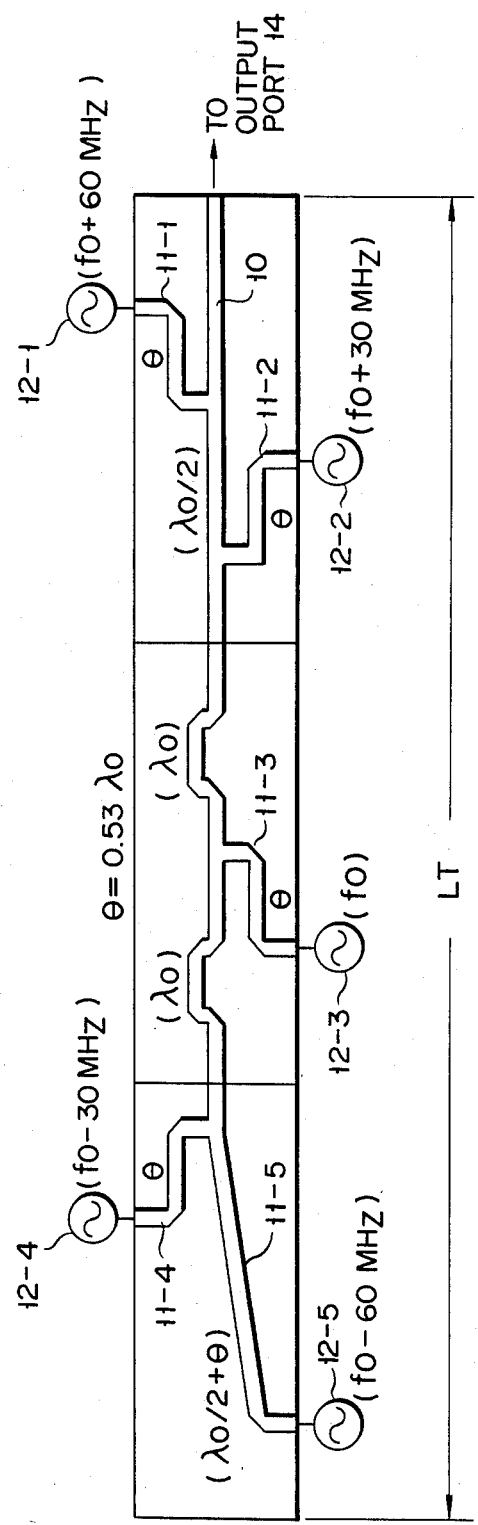

FREQUENCY-CHANGEABLE MICROWAVE SIGNAL GENERATOR HAVING PLURAL SELECTIVELY OPERATED OSCILLATORS

BACKGROUND OF THE INVENTION

The present invention relates to a frequency-changeable microwave signal generator.

Conventional microwave signal communication units and radar units often employ a single designated transmitting or receiving frequency. However, demand has recently arisen to change the transmitting or receiving frequency at predetermined intervals within a predetermined frequency band. To satisfy such demand for a microwave signal generator having a high frequency stability, a synthesizer-type microwave signal generator having a quartz oscillator as a reference is conventionally available. With this generator, however, the number of components is large and hence the circuit configuration is complex, resulting in a considerably large generator. Therefore, this conventional generator is not suited for incorporation in an actual system.

In order to solve these problems, generally, a required number of small, high frequency-stabilized microwave signal generators are provided, and are switched as needed. FIG. 1 shows a circuit diagram of a microwave signal generator according to this method.

Referring to FIG. 1, microwave signal oscillators 1-1 to 1-n having oscillating frequencies fl to fn, respectively, are connected to band-pass filters 2-1 to 2-n via transmission lines 3. The center frequencies of the passbands of these band-pass filters are set to fl to fn, respectively. Transmission lines 3 can be comprised of micro strip lines or the like. Filters 2-1 to 2-n are connected through further transmission lines 3 to circulators 4-1 to 4-n, respectively. Circulators 4-1 to 4-n are series-connected via transmission lines, and output port 5 connected to circulator 4-1 generates microwave power. Power supply $V_B$ is supplied to oscillators 1-1 to 1-n via switches 6-1 to 6-n, to operate them.

In the microwave signal generator having the above arrangement, when a microwave signal output of frequency fn is to be obtained, only switch 6-n is turned on, and all remaining switches 6-1 to 6-(n−1) are turned off. Then, a microwave signal of frequency fn is generated from oscillator 1-n, and is supplied to circulator 4-(n−1) through filter 2-n and circulator 4-n. Subsequently, the microwave signal of frequency fn is supplied to filter 2-(n−1) from circulator 4-(n−1) through transmission line 3, is reflected by filter 2-(n−1), and is returned to circulator 4-(n−1). This operation is repeated to generate a microwave signal of frequency fn from output port 5. When the microwave signal generator generates a microwave signal of another frequency, ON/OFF operation of switches 6-1 to 6-n is performed in the same manner, to enable a corresponding one of oscillators 1-1 to 1-n, thereby generating a microwave signal at a predetermined frequency.

However, the microwave signal generator of the above arrangement requires n filters and n circulators, resulting in a considerably large outer size. Furthermore, since the number of components is large, the reliability of the generator is degraded.

According to another conventional system, PIN diode switches are used in place of the circulators in the above microwave signal generator, and are interlinked with a power supply circuit switch (Japanese Patent Publication No. 60-11843). With this system, again, the circuit configuration is complex, and the number of components is large, resulting in a degraded reliability.

SUMMARY OF THE INVENTION

The present invention has been made to eliminate the above drawbacks and has as its object to provide a small, highly reliable frequency-changeable microwave signal generator having a simple circuit configuration.

In order to achieve the above object, a frequency-changeable microwave signal generator of the present invention comprises a plurality of microwave signal oscillators, a plurality of branch lines connected to the microwave signal oscillators, a transmission line connected to the plurality of branch lines and provided with an output port at one end thereof, and a means for selectively operating one of the microwave signal oscillators. The line lengths of the plurality of branch lines are set such that the output impedance of the microwave signal oscillators connected thereto, which is measured from the branch point for connecting the transmission line and the branch line, is at maximum when the microwave signal oscillator is inoperative. A relation $L=(\lambda/2)(k-1)$ (k is a natural number) is satisfied where L is a distance between adjacent branch points of portions of the branch lines connected to the transmission line, and $\lambda$ is a predetermined operational wavelength of the oscillator.

BRIEF DESCRIPTION OF THE DRAWINGS

FIG. 7 shows an embodiment of the present invention wherein transmission and branch lines are not linear.

DETAILED DESCRIPTION OF THE PREFERRED EMBODIMENTS

An embodiment of the present invention will now be described with reference to the accompanying drawings.

Figure 1:
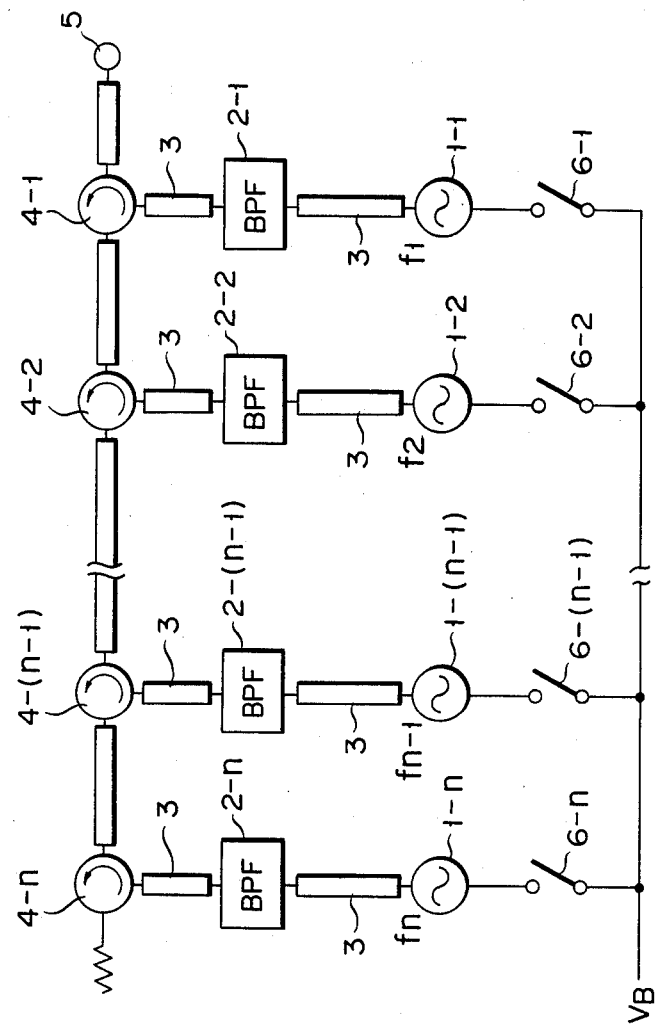
FIG. 1 is a circuit diagram of a conventional frequency-changeable microwave signal generator.
Figure 2:
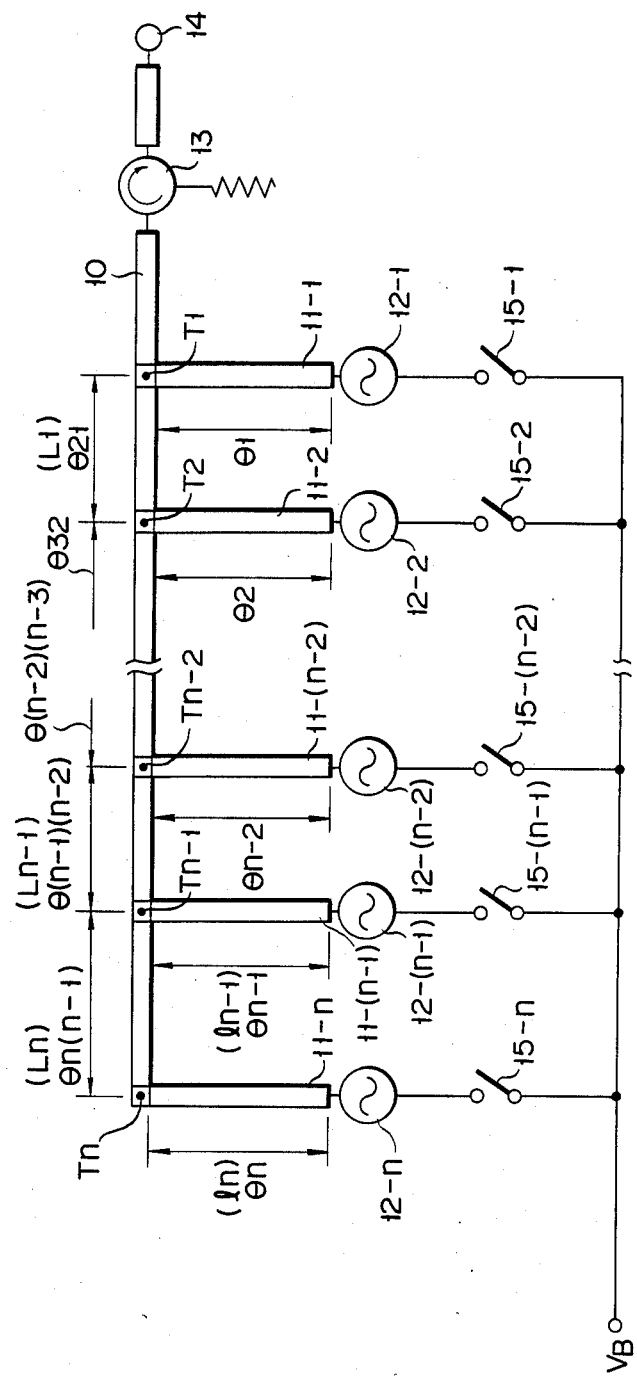
FIG. 2 is a circuit diagram of a frequency-changeable microwave signal generator according to an embodiment of the present invention.

FIG. 2 is a circuit diagram of a frequency-changeable microwave signal generator according to an embodiment of the present invention. Branch portion $T_n$ is provided at one end of transmission line 10, and branch portions $T_{n-1}$ to $T_1$ are provided spaced apart from branch portion $T_n$ with predetermined gaps therebetween. Branch portions $T_1$ to $T_n$ are connected to one end of branch lines 11-1 to 11-n, respectively. The other ends of branch lines 11-1 to 11-n are connected to microwave signal oscillators 12-1 to 12-n having fixed frequencies fl to fn, respectively. The other end of transmission line 10, i.e., the end not connected to oscillator 12-n, is connected to output port 14 via isolator 13.

Isolator 13 serves to prevent variations of the characteristics of the microwave signal generator from being changed due to variations in load with respect to oscillators 12-1 to 12-n connected to output port 14. If the variations in load do not cause any practical problem, isolator 13 can be omitted. Transmission line 10 and branch lines 11-1 to 11-n can be microstrip lines, strip lines, coaxial lines, waveguides, and the like. The physical shape of lines 10, and 11-1 to 11-n is not limited to a linear shape but can be any arbitrary shape defined in a three-dimensional space. In the present invention, the shape of the lines does not matter, but the effective length thereof is an important parameter.

Assume that the branch line lengths (or electrical lengths) between branch portions $T_1$ to $T_n$ and oscillators 12-1 to 12-n, respectively, are $l_1$ to $l_n$ (or $\theta_1$ to $\theta_n$), and that the transmission line lengths (or electrical lengths) between branch portions $T_1$ and $T_2$, . . . and $T_{n-1}$ and $T_n$ are $L_1$, . . . and $L_n$ (or $\theta_{21}$, . . . $\theta_{n(n-1)}$), respectively. Power supply $V_B$ is connected to oscillators 12-1 to 12-n via power on/off switches 15-1 to 15-n, in order to operate oscillators 12-1 to 12-n.

As microwave signal oscillators 12-1 to 12-n, oscillators having a stable frequency and comparatively high external quality factor Q (Qext) are used. (For instance, dielectric resonator or a cavity resonator, which uses a resonator of high unloaded Q, is used). Generally, Qext is more than about 1000. When such an oscillator having a high Qext is turned off, absolute value $|\Gamma x|$ of output reflection coefficient $\Gamma x$ measured from the load side is generally as large as $|\Gamma x| \gtrsim 0.7$.

Figure 3:
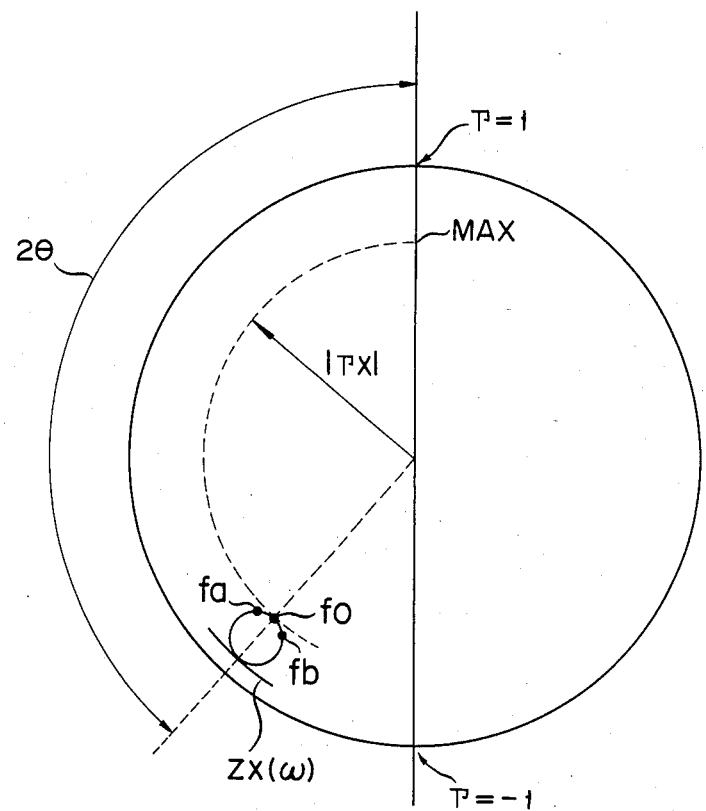
FIG. 3 is a Smith chart showing the output impedance of a microwave signal oscillator in an inoperative state.

FIG. 3 shows a trace of impedance $Zx(\omega)$ of an oscillator (having operational frequency f0) having a high Qext in the power supply OFF state, which is measured from the load side of the oscillator and which is shown on a reflection coefficient plane (Smith chart). Since the oscillator has a high Qext, the resonance mode circle of impedance $Zx(\omega)$ at operating frequency f0 is small, and absolute value $|\Gamma x|$ of the reflection coefficient in the vicinity of operational frequency f0 (e.g., in a frequency range of $\Delta f = fb - fa$ where $fa < f0 < fb$) is large.

In order to obtain a point at which the output impedance of the oscillator measured from the load side is at maximum, the point on the trace of impedance $Zx(\omega)$ at the output terminal of the oscillator, which corresponds to operating frequency f0, is shifted by electrical angle $\theta$ (phase angle $2\theta$ of the reflection coefficient) to the load side (position MAX in FIG. 3). Namely, the output impedance of the oscillator measured from the load side is at maximum at a point separated from the output terminal of the oscillator by electrical length $\theta$ (rad). Then, using reflection coefficient $\Gamma x$, the following equation is obtained:

$$Z_{0m} = Z_0 \times (1 + |\Gamma x|)/(1 - |\Gamma x|) \tag{1}$$

$Z_{0m}$ is the maximum output impedance, and $Z_0$ is the characteristic impedance of the branch line. When a transmission line having line length $l = \lambda_0(\theta/2\pi)$ and characteristic impedance $Z_0 = 50 \, \Omega$ is connected to an oscillator having operating frequency f0 and absolute value $|\Gamma x|$ of reflection coefficient $\Gamma x$ is $|\Gamma x| = 0.9$ in the inoperative state measured from the load side, the output impedance of the oscillator is $50 \, \Omega \times (1 + |\Gamma x|)/(1 - |\Gamma x|) = 950 \, \Omega$ at the end of the transmission line, thus providing a high impedance.

Referring to FIG. 2, assume that difference $\Delta f$ between the highest and lowest frequencies of microwave signal oscillators 12-1 to 12-n is $\Delta f << fx$ (where fx is substantially the median or average value of the operational frequencies of n oscillators). In other words, assume that the oscillating frequencies of the respective oscillators are close to each other. In this case, electrical lengths $\theta_1$ to $\theta_n$ from branch portions $T_1$ to $T_n$ of branch lines 11-1 to 11-n to the terminals of the respective oscillators, respectively, are set at frequency fx (wavelength $\lambda_x$) in accordance with a method similar to that shown by the Smith chart of FIG. 3. Electrical lengths $\theta_{21}, \theta_{32}, \ldots \theta_{n(n-1)}$ between branch portions $T_1$ and $T_2$, $T_2$ and $T_3$, . . . , and $T_{n-1}$ and $T_n$ are set to be $(\lambda_x/2)(k-1)$ (k is a natural number), respectively.

The branch line lengths ($l_1$ to $l_n$) and the distances ($L_1$ to $L_n$) between adjacent branch portions can be generally expressed for the xth length ($1 \leq x \leq n$) as follows:

$$l_x = \lambda_x(\theta_x/2\pi) \tag{2}$$

$$L_x = (\lambda_x/2)(k-1) \tag{3}$$

When oscillating frequencies f1 to fn of oscillators 12-1 to 12-n are to be separated by larger intervals, frequencies f1 to fn are set such that any one frequency is an integer multiple of another frequency, and the value of each of $l_x$ and $L_x$ is selected such that the power-off impedance of the oscillator, measured from the corresponding branch portion, becomes maximum.

In the microwave signal generator having the above arrangement, when microwave power of operating frequency f2 is to be output, only switch 15-2 is turned on, and all the remaining switches are turned off. In other words, only oscillator 12-2 is enabled. Then, all the remaining oscillators are disabled. As a result, when oscillator 12-n is observed with respect to branch portion $T_n$, branch line 11-n is at a high impedance level with respect to transmission line 10, as described earlier.

When oscillator 12-(n-1) is observed with respect to branch portion $T_{n-1}$, its output impedance connected to branch line 11-(n-1) is similarly high. Furthermore, the electrical length of transmission line $\theta_{n(n-1)}$ or $L_n$ between branch portions $T_n$ and $T_{n-1}$, is set at $(\lambda_x/2)(K-1)$, as described above, so that branch portion $T_{n-1}$ is also at a high impedance level. Similarly, branch portions $T_{n-2}$ to $T_3$ have high impedances.

Therefore, when branch portion $T_3$ is measured from branch portion $T_2$, it is at a high impedance due to the same effect as described above. The microwave signal of operating frequency f2 which is output from oscillator 12-2 is mostly fed to branch portion $T_1$ from portion $T_2$. Also, since oscillator 12-1 is inoperative, branch line 11-1 is similarly at a high impedance level with respect to branch portion $T_1$, so that this microwave signal is fed to output port 14 via isolator 13.

Figure 4:
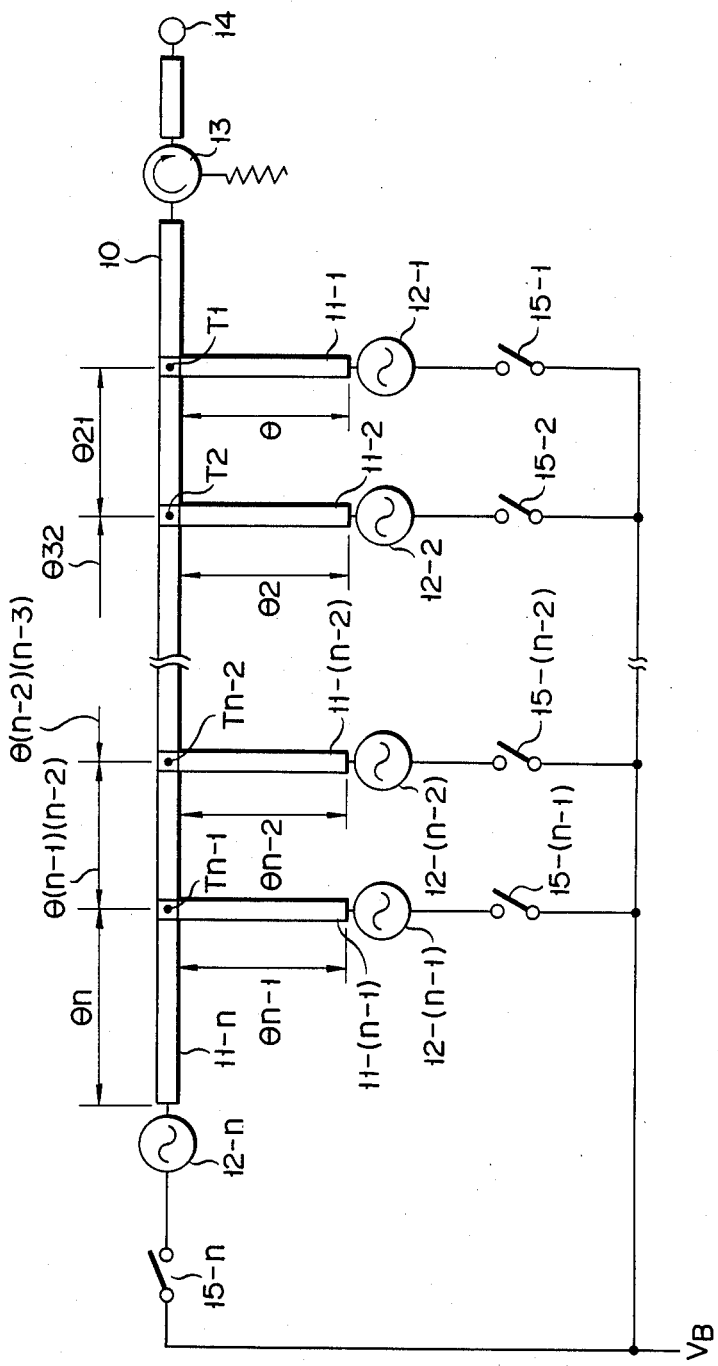
FIG. 4 is a circuit diagram of another embodiment of the present invention.

FIG. 4 shows another embodiment of the present invention, wherein the distance between some adjacent branch portions of the frequency-changeable microwave signal generator, shown in FIG. 2, is set at 0. More specifically, in FIG. 4, the distance ($L_n$) between branch portions $T_n$ and $T_{n-1}$, shown in FIG. 2, is set at 0, branch portion $T_n$ overlaps branch portion $T_{n-1}$, and two branch lines 11-n and 11-(n-1) are connected to branch portion $T_{n-1}$.

In the frequency-changeable microwave signal generator having the above arrangement, when a microwave signal of operating frequency f2 is to be output, only switch 15-2 is turned on, and all the remaining switches are turned off, as mentioned above. Therefore, when oscillators 12-n and 12-(n-1) are viewed from branch portion $T_{n-1}$, they are inoperative and hence at a high impedance level, so that branch portion $T_{n-1}$ is a high impedance point. Therefore, as described with reference to FIG. 3, output f2 from oscillator 12-2 is supplied to output port 14 through isolator 13.

Figure 5:
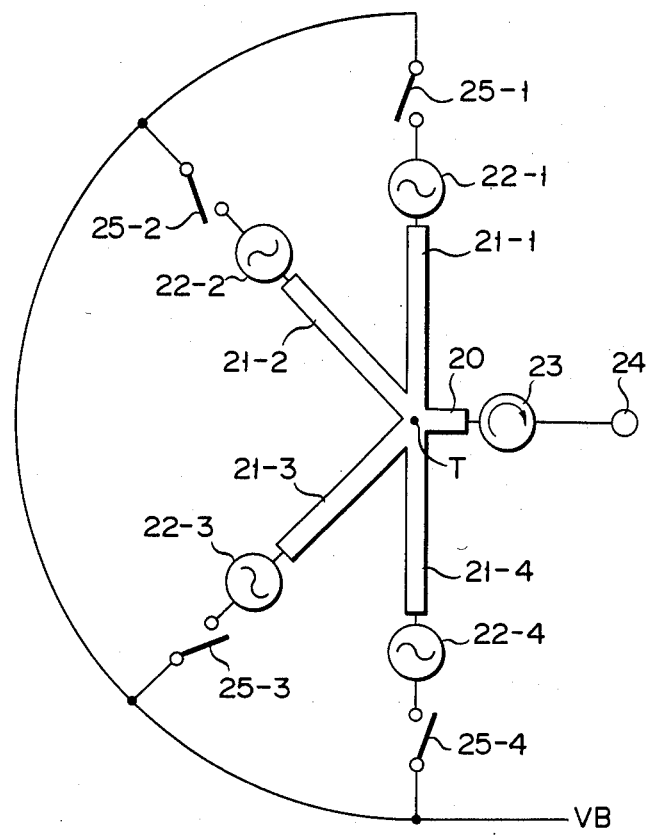
FIG. 5 is a circuit diagram of still another embodiment of the present invention.

FIG. 5 is a circuit diagram of a frequency-changeable microwave signal generator according to still another embodiment of the present invention, which can switch among four frequencies. Four branch lines 21-1 to 21-4 are branched from branch portion T at one end of transmission line 20. The ends of branch lines 21-1 to 21-4 are connected to microwave signal oscillators 22-1 to 22-4, which are connected to power supply $V_B$ in turn, through switches 25-1 to 25-4, respectively, to operate oscillators 22-1 to 22-4. The other end of transmission line 20 is connected to output port 24 through isolator 23.

Note that microwave signal oscillators 22-1 to 22-4 have oscillating frequencies f1 to f4, respectively, and have a relatively high Qext, as in the embodiment described above. The line lengths (electrical lengths) of branch lines 21-1 to 21-4 are set such that the output impedances of the oscillators, when power supply $V_B$ is OFF, are at maximum at substantially the median (average) value of the four oscillating frequencies thereof (refer to the Smith chart of FIG. 3).

The embodiment of FIG. 5 corresponds to that of FIG. 2, when lengths $L_1$ to $L_n$ are all set at 0. Accordingly, the operation of the embodiment of FIG. 5 is basically the same as that of FIG. 2.

Figure 6:
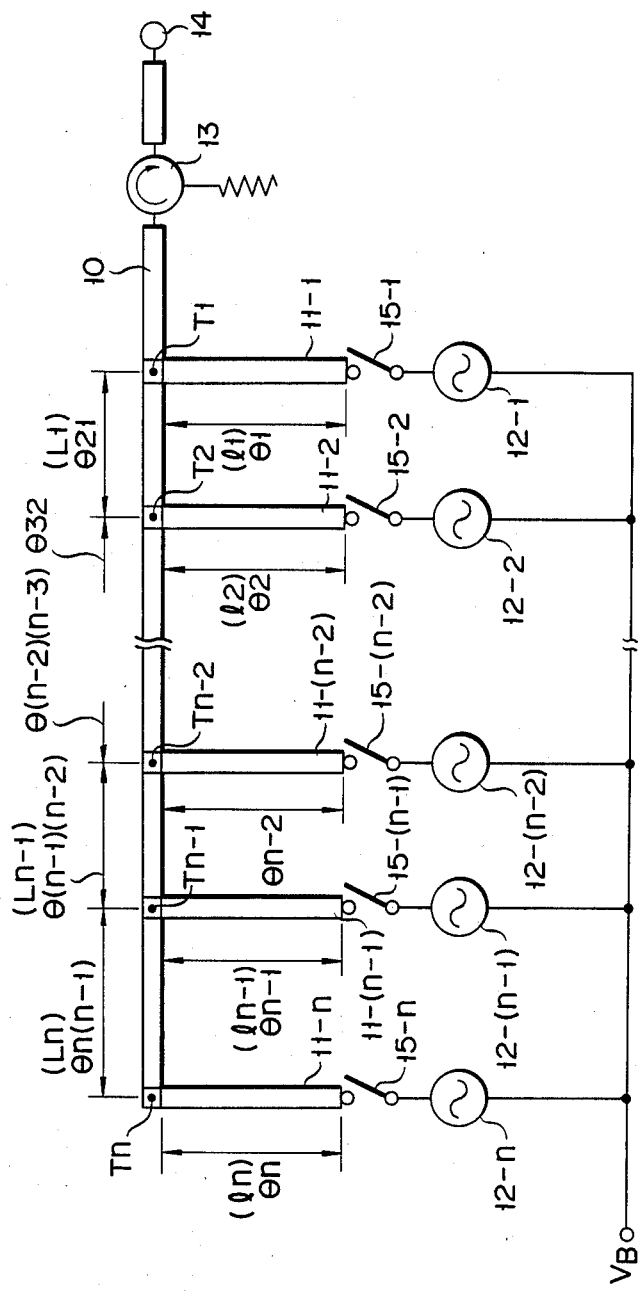
FIG. 6 shows a modification of the embodiment shown in FIG. 2.

FIG. 6 shows a modification of FIG. 2. In FIG. 6, signal switches 15-1 to 15-n having a sufficiently high impedance in the OFF state are provided between branch lines 11-1 to 11-n and oscillators 12-1 to 12-n, respectively. In this case, non-used oscillators 12-1 to 12-n need not be disabled. Furthermore, Qext of oscillators 12-1 to 12-n can be any value, so that the number of types of oscillators usable as oscillators 12-1 to 12-n is larger than in the case of FIG. 2. When high-impedance (open) signal switches 15-1 to 15-n, which turn OFF completely, are used, length $l_n$ of each of branch lines 11-1 to 11-n is set to be an integer multiple of the half-wavelength ($\lambda 0n/2$). With this arrangement, the microwave signal supplied to the branch line side from branch portion $T_n$ can be completely reflected to return onto transmission line 10.

When a microwave signal of a desired frequency is to be generated by a system with the above arrangement, the switch (any one of switches 15-1 to 15-n) of only one oscillator having the desired frequency is turned on, and all the remaining switches are turned off. Then, the impedances of switches 15-1 to 15-n, in the OFF state with respect to branch portions $T_1$ to $T_n$, respectively, of the branch lines, are substantially infinite, so that only the output of an operative oscillator is output from port 14 without any substantial loss.

As described above, according to the frequency-changeable microwave signal generator of the present invention, the frequency can be changed without a circulator or a band-pass filter (BPF). Therefore, microwave signal loss due to the circulator or BPF may not occur, thereby efficiently generating a pure microwave signal. Furthermore, the number of components can be reduced compared to the conventional generator, so that the overall generator can be made compact while increasing its reliability.

As described with reference to the embodiments of FIGS. 4 and 5, the distance $(\lambda x/2)(k-1)$ ($\lambda x$: the median or average value of the operational wavelengths of n oscillators; k: natural number) between the adjacent branch portions of the embodiment shown in FIG. 2 can be modified in various manners if k is selected arbitrarily. In addition, the respective lines can be non-linear, as shown in FIG. 7. FIG. 7 shows an embodiment wherein three line pattern blocks each having a length of 16 mm are connected in series (total length LT=48 mm). In FIG. 7, five branch lines (11-1 to 11-5) are provided. In this embodiment, electrical length $\theta$ is selected to be 0.53 $\lambda 0$ when the oscillating frequency of oscillator 12-3 is f0 and the wavelength thereof is $\lambda 0$. The oscillating frequencies of oscillators 12-1 to 12-5 are separated at 30-MHz intervals, provided that f0 > > 30 MHZ. With the pattern of FIG. 7, the overall generator can be made compact as compared to the generator of FIG. 2. Incidentally, from a practical viewpoint, the configuration of FIG. 7 is to be determined in conjunction with the size of the oscillator, the figure of the output interface, the electro-magnetic shield between respective oscillators, the heat dispersion structure, and so on. A suitable configuration of microwave lines can thus be obtained by the non-linear asymmetric arrangement, as shown in FIG. 7.

As described above, according to the present invention, when a branch line is connected to a branch portion of a transmission line, the branch line is designed such that the output impedance of a corresponding microwave signal oscillator therein is at maximum when the microwave signal oscillator is inoperative, so that a microwave signal of a desired frequency can be output from an output terminal of the transmission line. Therefore, a compact frequency-changeable microwave signal generator which has a simple circuit configuration and improved reliability can be provided without using a circulator or a band-pass filter.

What is claimed is:

1. A frequency-changeable microwave signal generator comprising:
   at least two microwave signal oscillating units;
   a microwave signal transmission line having an output port;
   at least two branch lines for respectively connecting said microwave signal oscillating units to said microwave signal transmission line, each of said branch lines having a length which is set at such a value to allow the impedance of said branch line measured from a connection point between said transmission line and said branch line to be substantially at maximum when said microwave signal oscillating unit connected to said branch line is in a state where it is not supplying a microwave signal thereto; and
   selective operating means for selectively operating any of said microwave signal oscillating units, so that a microwave signal is supplied from the operated microwave signal oscillating unit to said branch line.

2. A microwave signal generator according to claim 1, wherein the relation $lx = \lambda x(\theta x/2\pi)$ is substantially satisfied where $l_x$ ($1 \leq x \leq n$) is the line length of an arbitrary one of said branch lines, $\lambda x$ is the wavelength of a microwave signal from one of said microwave signal oscillating units, said one microwave signal oscillating unit being coupled to the arbitrary one of said branch lines, and $\theta x$ is the electrical angle of the microwave signal.

3. A microwave signal generator according to claim 1, wherein the relation $L_x = (\lambda x/2)(k-1)$ is substantially satisfied where Lx is the distance between a connection point of an arbitrary branch line among said branch lines and said transmission line and another connection point of a branch line, adjacent to said arbitrary branch line, and said transmission line, $\lambda x$ is the wavelength of a microwave signal obtained from a predetermined one of said microwave signal oscillating units, and k is a natural number.

4. A microwave signal generator according to claim 2, wherein the relation $L_x=(\lambda x/2)(k-1)$ is substantially satisfied where $L_x$ is the distance between a connection point of an arbitrary branch line among said branch lines and said transmission line and another connection point of a branch line, adjacent to said arbitrary branch line, and said transmission line, $\lambda x$ is the wavelength of a microwave signal obtained from a predetermined one of said microwave signal oscillating units, and k is a natural number.

5. A microwave signal generator according to claim 3, wherein the oscillating frequencies of said microwave signal oscillating units are selected such that $\Delta f$ is sufficiently smaller than fx where $\Delta f$ is the difference between the highest and lowest frequencies of microwave signals obtained from said microwave signal oscillating units, and fx is a median frequency of the microwave signals and corresponds to the wavelength $\lambda x$.

6. A microwave signal generator according to claim 4, wherein the oscillating frequencies of said microwave signal oscillating units are selected such that $\Delta f$ is sufficiently smaller than fx where $\Delta f$ is the difference between the highest and lowest frequencies of microwave signals obtained from said microwave signal oscillating units, and fx is a median frequency of the microwave signals and corresponds to the wavelength $\lambda x$.

7. A microwave signal generator according to claim 3, wherein the frequency of one of the microwave signals obtained from said microwave signal oscillating units is an integer multiple of the frequency of another.

8. A microwave signal generator according to claim 4, wherein the frequency of one of the microwave signals obtained from said microwave signal oscillating units is an integer multiple of the frequency of another.

9. A microwave signal generator according to claim 1, wherein said selective operating means includes means for turning on/off the power supply to each of said microwave signal oscillating units, and wherein
an external quality factor Q of each of said microwave signal oscillating units is larger than about 1000.

10. A microwave signal generator according to claim 2, wherein said selective operating means includes means for turning on/off the power supply to each of said microwave signal oscillating units, and wherein
an external quality factor Q of each of said microwave signal oscillating units is larger than about 1000.

11. A microwave signal generator according to claim 3, wherein said selective operating means includes means for turning on/off the power supply to each of said microwave signal oscillating units, and wherein
an external quality factor Q of each of said microwave signal oscillating units is larger than about 1000.

12. A microwave signal generator according to claim 1, wherein said selective operating means includes signal switch means for selectively supplying an oscillating output from said microwave signal oscillating units to said branch lines, respectively, said signal switch means having a circuit impedance sufficiently larger than a characteristic impedance of said branch line when the oscillating output is not supplied to said branch line.

13. A microwave signal generator according to claim 2, wherein said selective operating means includes signal switch means for selectively supplying an oscillating output from said microwave signal oscillating units to said branch lines, respectively, said signal switch means having a circuit impedance sufficiently larger than a characteristic impedance of said branch line when the oscillating output is not supplied to said branch line.

14. A microwave signal generator according to claim 3, wherein said selective operating means includes signal switch means for selectively supplying an oscillating output from said microwave signal oscillating units to said branch lines, respectively, said signal switch means having a circuit impedance sufficiently larger than a characteristic impedance of said branch line when the oscillating output is not supplied to said branch line.

15. A microwave signal generator according to claim 12, wherein an arbitrary branch line among said branch lines has a length, which is substantially an integer multiple of a half-wavelength of a microwave signal transmitted thereto.

16. A microwave signal generator according to claim 13, wherein an arbitrary branch line among said branch lines has a length, which is substantially an integer multiple of a half-wavelength of a microwave signal transmitted thereto.

17. A microwave signal generator according to claim 14, wherein an arbitrary branch line among said branch lines has a length, which is substantially an integer multiple of a half-wavelength of a microwave signal transmitted thereto.

18. A microwave signal generator according to claim 1, wherein at least two branch lines among said branch lines are connected to one point of said transmission line.

19. A microwave signal generator according to claim 2, wherein at least two branch lines among said branch lines are connected to one point of said transmission line.

20. A frequency-changeable microwave signal generator comprising:
a plurality of microwave signal oscillators;
a plurality of branch lines each having one end connected to one of said microwave signal oscillators;
a transmission line connected to the other ends of said plurality of branch lines and connected to an output port; and
means for selectively operating one of said microwave signal oscillators, wherein
the line length of each of said plurality of branch lines is set such that its impedance measured from a branch point for connecting said transmission line and said branch line is at maximum when its microwave signal oscillator is inoperative, and
the relation $L=(\lambda/2)(k-1)$ (k is a natural number) is satisfied where L is a distance along said transmission line between adjacent branch portions of said branch lines connected to said transmission line, and $\lambda$ is a predetermined operational wavelength.

* * * * *